United States Patent [19]
McMahon

[11] Patent Number: 5,903,432
[45] Date of Patent: May 11, 1999

[54] COMPUTER PACKAGE WITH A POLYGONAL SHAPED MOTHERBOARD

[75] Inventor: John Francis McMahon, Phoenix, Ariz.

[73] Assignee: Intel Corportation, Santa Clara, Calif.

[21] Appl. No.: 08/933,405

[22] Filed: Sep. 19, 1997

[51] Int. Cl.⁶ ........................................... H05K 7/20
[52] U.S. Cl. ..................... 361/690; 361/683; 361/697; 361/721; 361/735; 439/61; 165/80.3; 165/105; 60/228
[58] Field of Search ..................... 361/686, 687, 361/688, 690, 695, 696, 697, 704, 715, 720, 721, 735, 742, 753, 755, 775, 802, 796, 801–803; 439/28, 61, 66, 60; 165/104, 106, 165, 80.3, 80.4, 80.2, 104.33, 104.34, 185, 105; 60/231, 230, 228; 156/89

[56] References Cited

U.S. PATENT DOCUMENTS

| | | | |
|---|---|---|---|
| 3,434,014 | 3/1969 | Taynton | 361/895 |
| 3,785,895 | 1/1974 | Ettre et al. | 156/89 |
| 3,942,586 | 3/1976 | Fries | 165/105 |
| 5,060,111 | 10/1991 | Takashima | 361/384 |
| 5,483,422 | 1/1996 | Bowen et al. | 361/802 |
| 5,706,650 | 1/1998 | Thayer | 60/231 |
| 5,716,220 | 2/1998 | Siroky | 439/61 |

*Primary Examiner*—Leo P. Picard
*Assistant Examiner*—Michael Datskovsky
*Attorney, Agent, or Firm*—Blakely, Sokoloff, Taylor & Zafman

[57] ABSTRACT

An electronic assembly that includes a plurality of electronic substrates that are plugged into a polygonal shaped motherboard. The polygonal shape of the motherboard minimizes the electrical path between electronic substrates while providing enough space between adjacent substrates to allow a fluid to sufficiently remove heat generated by integrated circuits of the substrates.

8 Claims, 3 Drawing Sheets

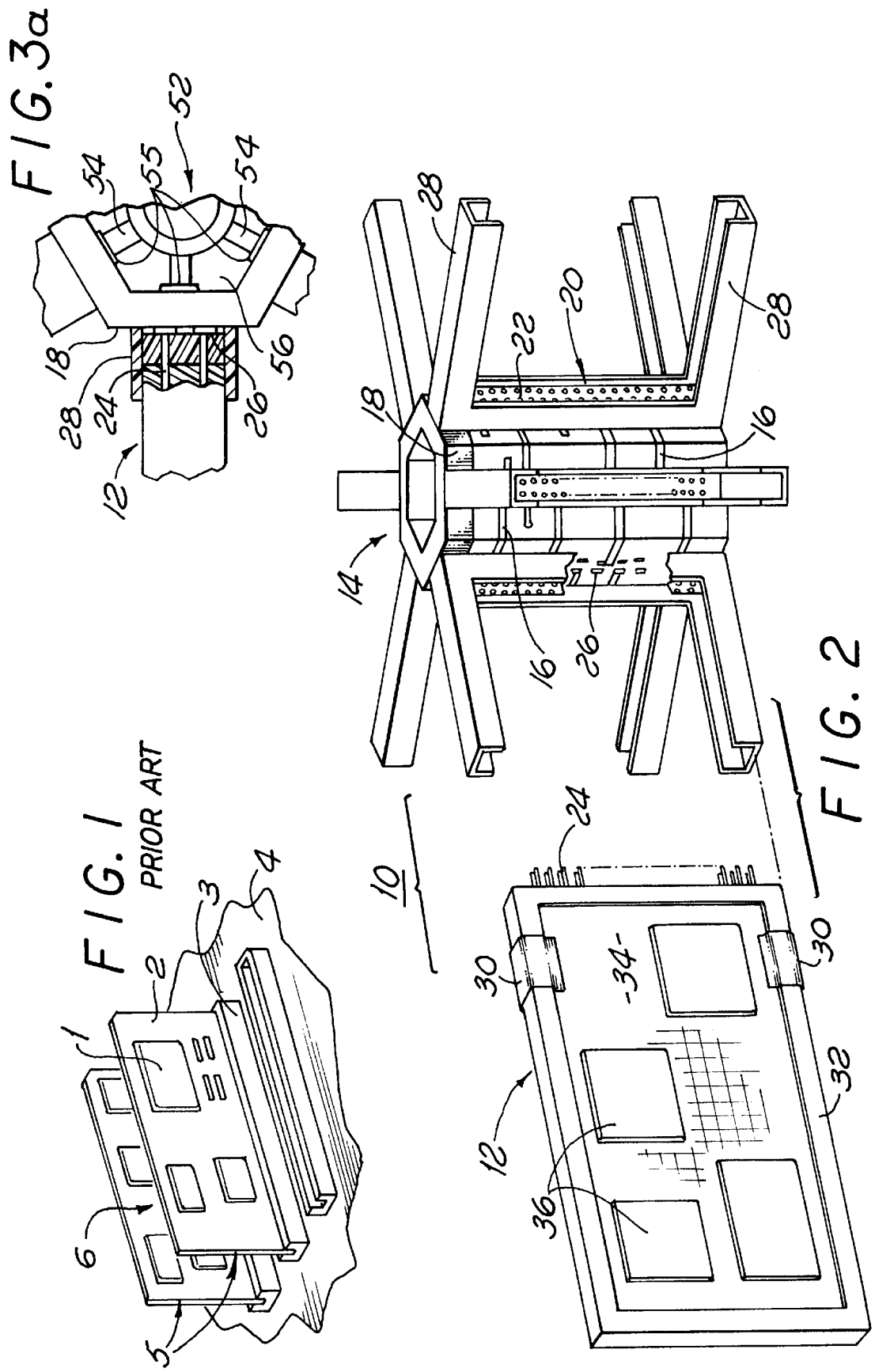

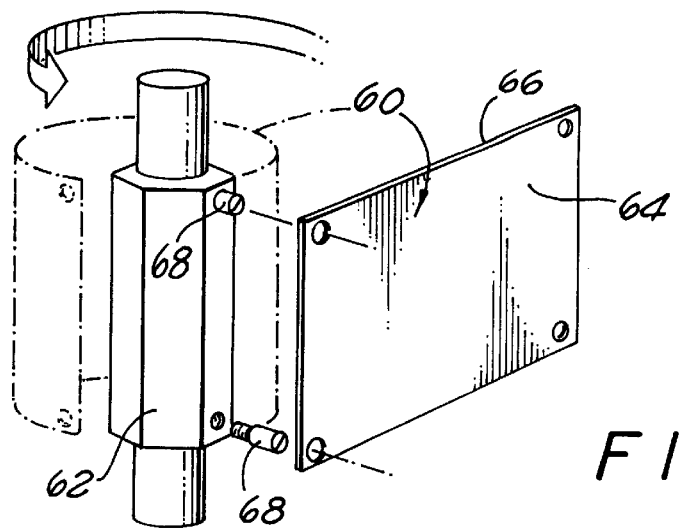
FIG. 5a
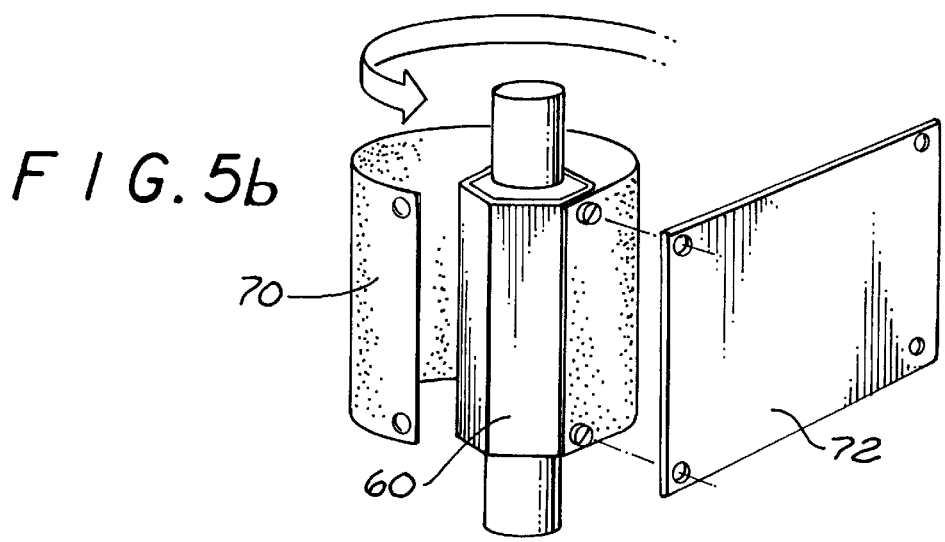
FIG. 5b
FIG. 5c
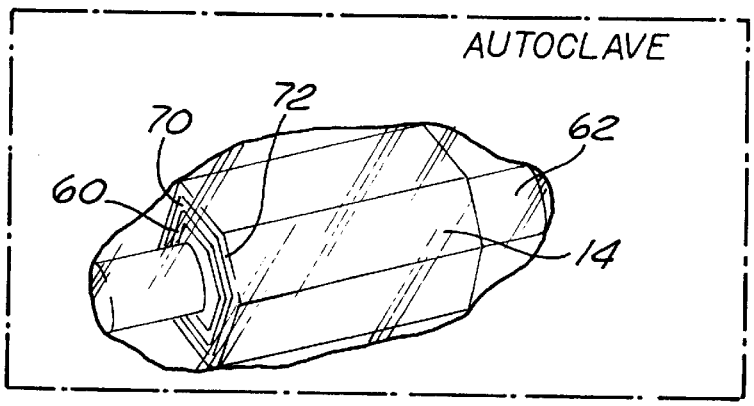

COMPUTER PACKAGE WITH A POLYGONAL SHAPED MOTHERBOARD

BACKGROUND OF THE INVENTION

1. Field of the Invention

The present invention relates to an electronic packaging assembly.

2. Description of Related Art

Integrated circuits are typically assembled to a package. As shown in FIG. 1 a number of integrated circuit packages 1 can be mounted to a printed circuit board 2, commonly referred to as a daughterboard. A number of daughterboards can be plugged into electrical connectors 3 that are mounted to another printed circuit board 4, commonly referred to as a motherboard.

The integrated circuits generate heat which must be removed to maintain the junction temperatures of the circuits within operational limits. The heat is typically removed by an airstream 5 that is generated by a fan (not shown). The air flows between the spaces 6 that separate the daughterboards 2.

The motherboard 4 contains routing traces and power/ground busses that support the operation of the daughterboards 2. The integrated circuits of one daughterboard 2 communicate with the integrated circuits of another daughterboard 2 through the connectors 3 and the motherboard 4.

The daughterboards 2 may contain relatively high speed integrated circuits such as a central processing unit (CPU) and accompanying electrical devices such as memory, etc. The electrical signals transmitted through the motherboard 4 are susceptible to electrical noise that may degrade the performance of the circuits. The noise can be minimized by narrowing the spaces 6 between the daughterboards 2. The smaller spaces 6 reduce the lengths of the routing traces of the motherboard 4. Unfortunately, reducing the spaces 6 also chokes off the air flow that removes the heat from the integrated circuits. The length of the routing traces are therefore limited by the thermal requirements of the assembly. It would be desirable to provide an electronic package assembly that minimizes the routing length of the motherboard while providing enough space between adjacent daughterboards to allow an air flow that is sufficient to remove heat from the integrated circuits.

SUMMARY OF THE INVENTION

The present invention is an electronic assembly that includes a plurality of electronic substrates that are plugged into a polygonal shaped motherboard. The polygonal shape of the motherboard minimizes the electrical path between electronic substrates while providing enough space between adjacent substrates to allow a fluid to sufficiently remove heat generated by integrated circuits of the substrates.

BRIEF DESCRIPTION OF THE DRAWINGS

FIG. 1 is a perspective view showing an electronic assembly of the prior art;

FIG. 2 is a perspective view of an electronic assembly of the present invention;

FIG. 3a is a top sectional view showing an internal connector coupled to internal pads of a polygonal shaped motherboard;

FIGS. 5a–c is a perspective view showing the polygonal shaped motherboard being assembled.

DETAILED DESCRIPTION OF THE INVENTION

Figure 3:
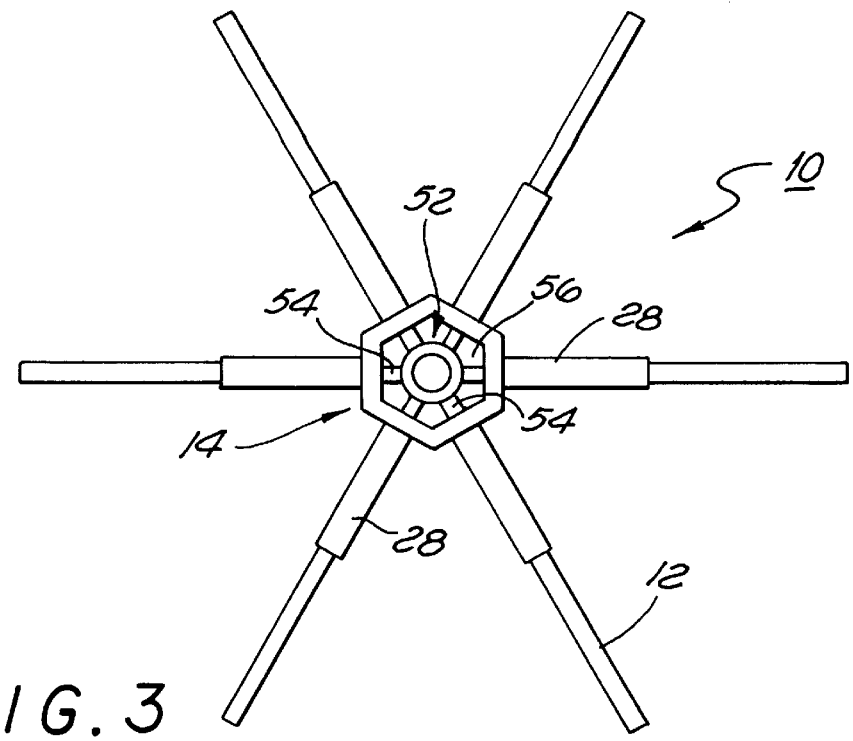
FIG. 3 is a top view of the electronic assembly showing electronic substrates plugged into a polygonal shaped motherboard.

Referring to the drawings more particularly by reference numbers, FIGS. 2 and 3 show an electronic assembly 10 of the present invention. The assembly 10 includes a plurality of electronic substrates 12 that are plugged into a polygonal shaped motherboard 14. The motherboard 14 is preferably a printed circuit board which has a plurality of routing traces 16 and power/ground busses 18 that are coupled to the electronic substrates 12.

The assembly 10 preferably has a plurality of electrical connectors 20 that are mounted to each side of the motherboard 14. Each connector 20 has a plurality of contacts 22 that mate with corresponding contacts 24 located on each substrate 12. The contacts 22 typically have pins (not shown) that are soldered to corresponding surface pads 26 of the motherboard 14.

The connectors 20 may also have a pair of guide rails 28 that guide and support the substrates 12. In the preferred embodiment the guide rails 28 are attached to the power/ground busses 18 of the motherboard 14. One guide rail 28 may be dedicated to electrical power while the other rail 28 is dedicated to electrical ground. The guide rails 28 engage corresponding conductive strips 30 of the electronic substrates 12 when the substrates 12 are plugged into the connectors 20. The conductive strips 30 are coupled to the power/ground busses (not shown) of the substrates 12. The guide rails 28 provide a robust power/ground connector which has a relatively low impedance. The power/ground rails 28 also eliminate the need for dedicating some of the electrical contacts 22 and 24 to power and ground, thereby allowing more contacts 22 and 24 for digital input/output (I/O) signals. Although a connector 20 with electrical contacts 22 is shown and described, it is to be understood that each electronic substrate 12 may have a connector that allows the substrate to be mated with the surface pads 26 of the motherboard 14. By way of example, the substrates 12 may each have a gold dot connector that mates with the surface pads 26.

The substrates 12 each contain a frame 32 that contains the contacts 24 and supports a printed circuit board 34. A plurality of integrated circuit packages 36 are mounted to the board 34. The board 34 provides electrical communication between the packages 36 and the contacts 24. The metal strips 30 are typically attached to each side of the frame 32. A substrate 12 can be plugged into the motherboard 14 by sliding the frame 32 along the guide rails 28 until the contacts 22 and 24 are mated. The integrated circuit packages 36 may contains integrated circuits (not shown) such as a central processing unit, memory and other electrical devices. The processing, memory and logic circuits of an entire computer may be integrated into a single electronic assembly 10.

Figure 4:
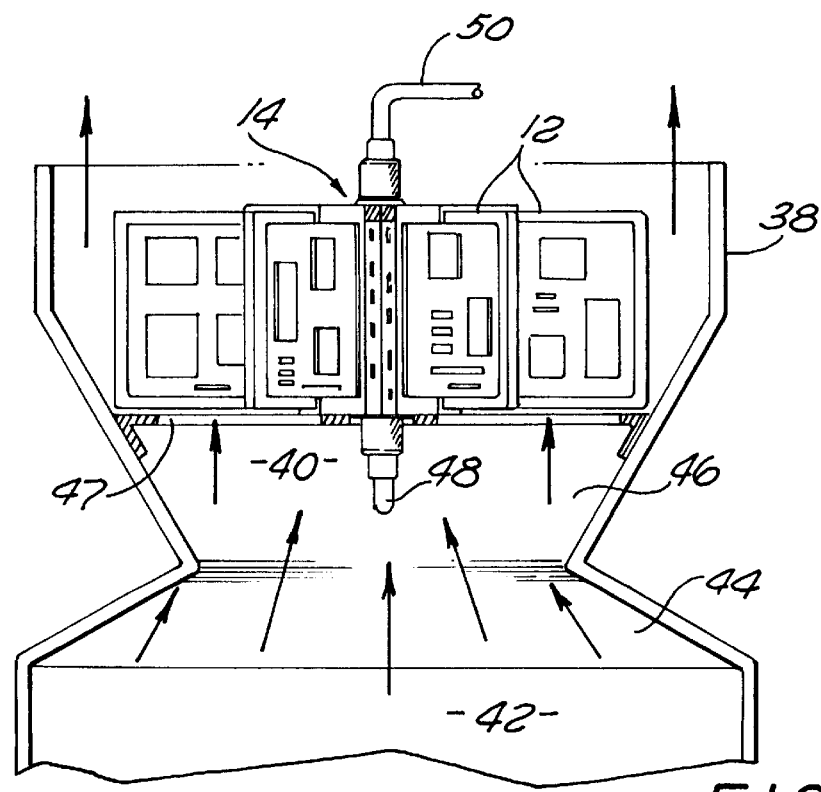
FIG. 4 is a side view showing the electronic assembly within a cooling system.

FIG. 4 shows the motherboard 14 and substrates 12 enclosed by a housing 38. The housing 38 has a plenum 40 that is coupled to a cooling system 42. The cooling system 42 may be a fan that generates an airstream which flows across the substrates 12. The airflow removes heat generated by the integrated circuits located on the substrate 12. The airflow is in a direction that is essentially perpendicular to the longitudinal axis of the substrates 12. Such a flow of air will result in a more uniform temperature gradient across the length of the substrate 12 than electronic assemblies of the prior art which tend to direct the air parallel with the longitudinal axis.

The housing 38 may have a nozzle section 44 that compresses and increases the pressure of the air, and a diffuser section 46 which accelerates the air across the substrates 12. Accelerating the airflow increases the heat transfer rate from the substrates 12 and lowers the junction temperatures of the integrated circuits. Although air is described, it is to be understood that other fluids may be employed. The housing 38 may have a bracket 47 that supports the motherboard 14 and substrates 12 within the plenum 40.

The motherboard 14 may be connected to an external power/ground cable 48 and an external I/O cable 50. As shown in FIG. 3, the cable 48 may have a connector 52 with spring loaded contacts 54 that engage surface pads 55 located within a center opening 56 of the polygonal shaped motherboard 14. Likewise, the I/O cable 50 may also have a connector (not shown) that is plugged into the motherboard 14. The I/O cable 50 may contain optic fibers.

The polygonal shaped motherboard 14 minimizes the length of the routing traces 16 that electrically connect the electronic substrates 12. The relatively short routing traces lower the impedance and the electrical noise, such as "cross talk", in the digital signals carried by the traces 16. The polygonal shape minimizes the routing trace lengths while providing enough space between adjacent electronic substrates so that there is an adequate flow of air to remove the heat generated by the integrated circuits.

FIGS. 5a–c show a method for creating the polygonal shaped motherboard 14. As shown in FIG. 5a, a sheet 60 is initially wrapped around a polygonal shaped mandrel 62. The sheet 60 has a layer of copper material 64 located on a layer of dielectric material 66. The sheet 60 is typically aligned and held in place by a pair of pins 68 that extend from the mandrel 62. A circuit pattern may be formed in the copper material 64 before wrapping the sheet 60 about the mandrel 62, or etched from the copper after attachment to the mandrel 62. Although one layer of copper is shown, it is to be understood that the sheet 60 may be "double-sided" so that there is a copper circuit pattern on the opposite side of the dielectric. By way of example, the opposite circuit pattern may be the surface pads 55 that are located within the center opening 56 of the motherboard 14 and attached to the external cables 48 and 50.

As shown in FIG. 5b, a layer of adhesive 70 is then wrapped around the sheet 60. The adhesive 70 is typically an epoxy commonly referred to as B-stage that reflows when subjected to an elevated temperature.

As shown in FIG. 5c a second sheet 72 can be wrapped around the adhesive 70. Vias holes (not shown) can be formed in the second sheet 72 for subsequent formation of electrical vias. The mandrel and sheets may be enclosed by a vacuum bag and placed within an autoclave that subjects the sheets to elevated temperatures and pressures which reflow the adhesive 70. The adhesive sets so that the sheets 60 and 70 are attached to each other in the polygonal configuration. Vias can then be formed within the polygonal board. The process of wrapping adhesive and dielectric/copper sheets about the mandrel 62 can be repeated to create a multi-layer board. The mandrel 62 is then removed to create the polygonal shaped motherboard 14.

What is claimed is:

1. An electronic assembly, comprising:

a polygonal shaped motherboard which has an external surface and an internal surface located within a center opening, said internal surface having a surface pad a connector that is located within said center opening and which has a spring load contact that engages said surface pad of said polygonal shaped motherboard; and, an electronic substrate that is coupled to said external surface of said polygonal shaped motherboard.

2. The assembly as recited in claim 1, further comprising an external connector that is attached to said polygonal shaped motherboard and coupled to said electronic substrate.

3. The assembly as recited in claim 2, wherein said connector has a pair of power/ground guide rails that engage a pair of corresponding power/ground strips located along a pair of edges of said electronic substrate.

4. The assembly as recited in claim 1, further comprising a cooling system that directs a fluid across said electronic substrate.

5. The assembly as recited in claim 4, wherein the fluid flows in a direction that is essentially perpendicular to a longitudinal axis of said electronic substrate.

6. The assembly as recited in claim 4, wherein said polygonal shaped motherboard and said electronic substrate are located within a housing which has a nozzle section and a diffuser section that accelerate the fluid flow across said electronic substrate.

7. The assembly as recited in claim 1, further comprising an external cable that is attached to said connector.

8. The assembly as recited in claim 1, wherein each electronic substrate includes an integrated circuit package that is mounted to a printed circuit board.

\* \* \* \* \*